United States Patent
Jeng et al.

(10) Patent No.: US 6,251,777 B1
(45) Date of Patent: Jun. 26, 2001

(54) THERMAL ANNEALING METHOD FOR FORMING METAL SILICIDE LAYER

(75) Inventors: Shwangming Jeng; Chen-Hua Yu, both of Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/261,994

(22) Filed: Mar. 5, 1999

(51) Int. Cl.$^7$ .................................................. H01L 21/44
(52) U.S. Cl. ..................... 438/682; 438/649; 438/655; 438/657; 438/660; 438/663
(58) Field of Search ................................ 438/682, 649, 438/655, 657, 663, 660

(56) References Cited

U.S. PATENT DOCUMENTS

| | | | |
|---|---|---|---|
| H1543 | 6/1996 | Wilber et al. ........................ | 428/446 |
| 4,359,490 | 11/1982 | Lehrer ................................... | 427/95 |
| 4,470,189 | 9/1984 | Roberts et al. ....................... | 29/571 |
| 4,814,294 | 3/1989 | West et al. ........................... | 437/200 |
| 5,344,793 | 9/1994 | Zeininger et al. ................... | 437/200 |
| 5,397,744 * | 3/1995 | Sumi et al. .......................... | 438/682 |
| 5,576,244 | 11/1996 | Hayashi et al. ...................... | 437/200 |
| 5,731,239 | 3/1998 | Wong et al. ......................... | 438/296 |
| 5,926,728 * | 7/1999 | Lee et al. ............................. | 438/586 |

* cited by examiner

Primary Examiner—Tan T. Nguyen
Assistant Examiner—RenéeR. Berry
(74) Attorney, Agent, or Firm—George O. Saile; Stephen B. Ackerman; Stephen G. Stanton

(57) ABSTRACT

A method for forming a metal silicide layer. There is first provided a substrate. There is then formed over the substrate a silicon layer, where the silicon layer has other than an amorphous silicon surface. There is then annealed thermally the silicon layer at a temperature greater than a silicidation temperature for forming a metal silicide layer upon the silicon layer to thus form from the silicon layer a thermally annealed silicon layer. Finally, there is then deposited upon the thermally annealed silicon layer a metal silicide forming metal while employing a metal deposition method such that upon contact with the thermally annealed silicon layer the metal silicide forming metal reacts in-situ to form a metal silicide layer upon a partially consumed thermally annealed silicon layer formed from the thermally annealed silicon layer.

16 Claims, 4 Drawing Sheets

THERMAL ANNEALING METHOD FOR FORMING METAL SILICIDE LAYER

BACKGROUND OF THE INVENTION

1. Field of the Invention

The present invention relates generally to methods for forming metal silicide layers within microelectronics fabrications. More particularly, the present invention relates to thermal annealing methods for forming metal silicide layers within microelectronics fabrications.

2. Description of the Related Art

Microelectronics fabrications are formed from microelectronics substrates over which are formed patterned microelectronics conductor layers which are separated by microelectronics dielectrics layers.

As microelectronics fabrication integration levels have increased and microelectronics device and patterned microelectronics conductor layer dimensions have decreased, it has become increasingly more important to form within microelectronics fabrications patterned microelectronics conductor layers to which uniformly low resistance connections may be made. In order to form such uniformly low contact resistance connections to patterned microelectronics conductor layers within microelectronics fabrications, it is common in the art of microelectronics fabrication to employ a patterned metal silicide layer, often formed in a self aligned fashion, formed upon the patterned microelectronics conductor layer.

While the use of patterned metal silicide layers as low contact resistance layers formed upon patterned microelectronics conductor layers is thus common in the art of microelectronics fabrication, the use of patterned metal silicide layers as low contact resistance layers formed upon patterned microelectronics conductor layers is nonetheless not entirely without problems in the art of microelectronics fabrication. In particular, it is often difficult to form such patterned metal silicide layers simultaneously with uniformly low contact resistance and with minimal process complexity.

It is thus towards the goal of forming within microelectronics fabrications metal silicide layers with uniformly low contact resistance and minimal process complexity that the present invention is directed.

Various methods and microelectronics structures have been disclosed in the art of microelectronics fabrication for forming metal silicide layers and/or for using metal silicide layers within microelectronics fabrications.

For example, Lehrer, in U.S. Pat. No. 4,359,490, discloses a chemical vapor deposition (CVD) method for forming at a comparatively low deposition temperature a metal silicide layer within a microelectronics fabrication. The chemical vapor deposition (CVD) method is a chemical vapor deposition (CVD) co-deposition method which employs silane as a silicon source material, simultaneously with an appropriate metal chloride vapor as a metal source material, when forming the metal silicide layer.

In addition, West et al., in U.S. Pat. No. 4,814,294, discloses a chemical vapor deposition (CVD) method for forming cobalt silicide layers of various atomic compositions within microelectronics fabrications. The chemical vapor deposition (CVD) method simultaneously employs a cobalt carbonyl as a cobalt source material and a silane or a halogenated silane as a silicon source material when forming the cobalt silicide layers.

Further, Zeininger et al., in U.S. Pat. No. 5,344,793, discloses a method for forming within a microelectronics fabrication a cobalt silicide layer upon a crystalline silicon substrate at a temperature at or near room temperature. The method employs an argon ion sputtering of the crystalline silicon substrate to form a thin damaged region of the crystalline silicon substrate prior to depositing cobalt metal upon the thin damaged region of the crystalline silicon substrate to thus form by in-situ reaction at room temperature a cobalt silicide layer at the location of the thin damaged region of the crystalline silicon substrate.

Yet further, Roberts et al., in U.S. Pat. No. 4,470,189, discloses a method for forming a metal silicide polycide (metal silicidel/polysilicon stack) layer with improved linewidth control within a microelectronics fabrications. The method employs a photoresist lift-off stencil for forming a composite evaporated metal and silicon layer which is subsequently thermally annealed to form a metal silicide layer employed within the metal silicide polycide layer.

Still yet further, Wilber et al., in U.S. Statutory Invention Registration No. H 1543, discloses a microelectronics fabrication employing a cobalt silicide metal silicide layer or a nickel silicide metal silicide layer as an electrode substrate layer for a ferroelectric layer within the microelectronics fabrication. By employing the cobalt silicide metal silicide layer or the nickel silicide metal silicide layer as the electrode substrate layer, the ferroelectric layer may be formed epitaxially.

Still yet further, Hayashi et al., in U.S. Pat. No. 5,576,244, discloses a method for forming a metal silicide interconnect layer bridging from a silicon semiconductor substrate to a conductor layer formed over a dielectric isolation layer within a semiconductor integrated circuit microelectronics fabrication. Within the method there is employed a patterned silicon layer formed over portions of a metal silicide forming metal layer not in contact with the silicon semiconductor substrate to provide a silicon source layer when forming while employing a thermal annealing method the metal silicide interconnect layer by thermal annealing the patterned silicon layer and the metal silicide forming metal layer.

Finally, Wong et al., in U.S. Pat. No. 5,731,239, discloses a method for forming, with uniform and low contact resistance, a polycide gate electrode for use within a field effect transistor (FET) within a semiconductor integrated circuit microelectronics fabrication. The method employs an amorphizing ion implant into a polysilicon gate electrode prior to forming and thermally annealing upon the polysilicon gate electrode a metal silicide forming metal layer.

Desirable in the art of microelectronics fabrication are additional methods and materials which may be employed to form within microelectronics fabrications metal silicide layers. Particularly desirable in the art of microelectronics fabrication are additional methods and materials which may be employed within microelectronics fabrications to form metal silicide layers with uniformly low contact resistance and minimal process complexity.

It is towards the foregoing objects that the present invention is both generally and more specifically directed.

SUMMARY OF THE INVENTION

A first object of the present invention is to provide a method for forming a metal silicide layer within a microelectronics fabrication.

A second object of the present is to provide a method in accord with the first object of the present invention, where the metal silicide layer is formed with uniformly low contact resistance and minimal process complexity.

A third object of the present invention is to provide a method in accord with the first object of the present invention or the second object of the present invention, which method is readily commercially implemented.

In accord with the objects of the present invention, there is provided by the present invention a method for forming a metal silicide layer within a microelectronics fabrication. To practice the method of the present invention, there is first provided a substrate having formed thereover a silicon layer, where the silicon layer has other than an amnorphized silicon surface. There is then annealed thermally the silicon layer at a temperature greater than a sificidation temperature for forming a metal silicide layer upon the silicon layer to thus form from the silicon layer a thermally annealed silicon layer. Finally, there is then deposited upon the thermally annealed silicon layer a metal silicide forming metal employing a metal deposition method such that upon contact with the thermally annealed silicon layer the metal silicide forming metal reacts in-situ to form a metal silicide layer upon a partially consumed thermally annealed silicon layer formed from the thermally annealed silicon layer.

The present invention provides a method for forming a metal silicide layer within a microelectronics fabrication, where the metal silicide layer is formed with uniformly low contact resistance and minimal process complexity. The method of the present invention realizes the foregoing objects by employing when forming the metal silicide layer a thermally annealed silicon layer having a surface other than an amorphous silicon surface, where the thermally annealed silicon layer is thermally annealed at a temperature greater than a silicidation temperature for forming a metal silicide layer upon the silicon layer. There is then deposited upon the thermally annealed silicon layer a metal silicide forming metal while employing a method such that the metal silicide forming metal reacts in-situ with the thermally annealed silicon layer to form a metal silicide layer and upon a partially consumed thermally annealed silicon layer derived from the thermally annealed silicon layer.

The present invention is readily commercially implemented. The present invention employs methods and materials as are otherwise generally known in the art of microelectronics fabrication. Since it is a process control and process ordering within the method of the present invention which at least in part provides the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming within a microelectronics fabrication a metal silicide layer with uniformly low contact resistance and minimal process complexity. The present invention realizes the foregoing objects by annealing thermally a silicon layer having other than an amorphized silicon surface at a temperature greater than a silicidation temperature for forming a metal silicide layer upon the silicon layer to thus form from the silicon layer a thermally annealed silicon layer. There is then deposited upon the thermally annealed silicon layer a metal silicide forming metal employing a metal deposition method such that upon contact with the thermally annealed silicon layer the metal silicide forming metal reacts in-situ to form a metal silicide layer upon a partially consumed thermally annealed silicon layer formed from the thermally annealed silicon layer.

The method of the present invention may be employed when fabricating metal silicide layers within microelectronics fabrications including but not limited to integrated circuit microelectronics fabrications, solar cell microelectronics fabrications, ceramic substrate microelectronics fabrications and flat panel display microelectronics fabrications.

First Preferred Embodiment

Figure 1:
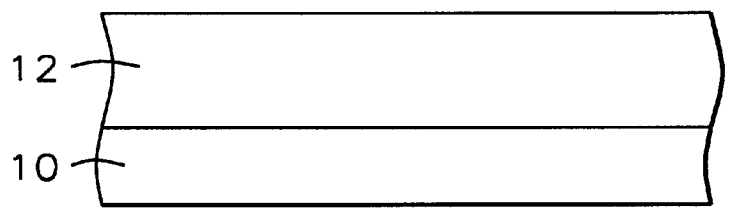
FIG. 1, FIG. 2 and FIG. 3 shown a series of schematic cross-sectional diagrams illustrating the results of forming, in accord with a general embodiment of the present invention which comprises a first preferred embodiment of the present invention, a metal silicide layer upon a silicon layer within a microelectronics fabrication.
Figure 2:
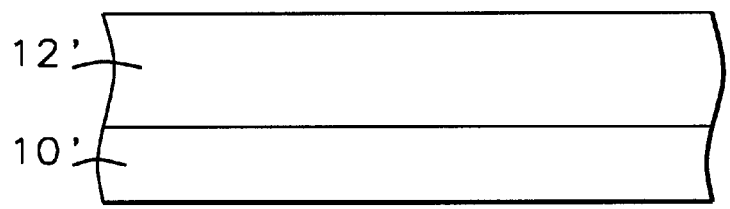
Figure 2:
Figure 3:
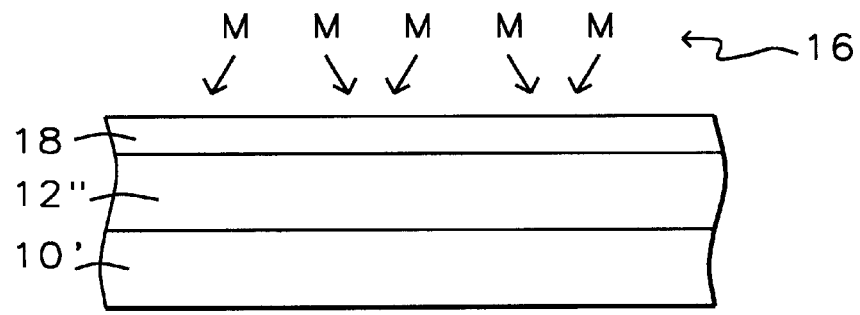
Figure 3:

Referring now to FIG. 1 to FIG. 3, there is shown a series of schematic crosssectional diagrams illustrating the results of forming, in accord with a general embodiment of the present invention which comprises a first preferred embodiment of the present invention, a metal silicide layer within a microelectronics fabrication in accord with the method of the present invention. Shown in FIG. 1 is a schematic cross-sectional diagram of the microelectronics fabrication at an early stage in its fabrication in accord with the present invention.

Shown in FIG. 1 is a substrate 10 having formed thereupon a silicon layer 12. Within the first preferred embodiment of the present invention, the substrate 10 may be a substrate employed within a microelectronics fabrication selected from the group including but not limited to integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication, or in the alternative, the substrate 10 may be the substrate as employed within the microelectronics fabrication, where the substrate has any of several additional microelectronics layers formed thereupon or thereover as are common within the microelectronics fabrication within which is employed the substrate 10. Such additional microelectronics layers may include, but are not limited to, microelectronics conductor layers, microelectronics semiconductor layers and microelectronics dielectric layers.

Within the first preferred embodiment of the present invention with respect to the silicon layer 12, the silicon layer 12 may be formed from any of several types of silicon materials as are common in the art of microelectronics fabrication, including but not limited to monocrystalline silicon materials and polycrystalline silicon (polysilicon) materials, provided that the silicon layer 12 does not have an amorphized silicon surface. For the purposes of the present invention, amorphized silicon surfaces are intended as silicon surfaces which may be obtained from any of several processes, including but not limited to: (1) deposition processes which form amorphous silicon layers; and (2) energetic beam treatment processes undertaken on polycrystalline silicon layer surfaces or monocrystalline silicon layer surfaces, such energetic beam treatment processes including but not limited to: (a) sputter treatment processes undertaken on polycrystalline silicon layer surfaces or monocrystalline silicon layer surfaces (such as is disclosed, for example within Zeininger et al., U.S. Pat. No. 5,344,793, as cited within the Description of the Related Art); and (b) ion implant treatment processes undertaken on polycrystalline silicon layer surfaces or monocrystalline silicon layer surfaces (such as disclosed, for example, within Wong et al., U.S. Pat. No. 5,731,239, as also cited within the Description of the Related Art). Within the first preferred embodiment of the present invention, the silicon layer 12 is preferably either a polycrystalline silicon layer or a monocrystalline silicon layer, either of which may have been treated with a hydrofluoric acid etchant to remove a native silicon oxide layer from the surface of the silicon layer 12. The thickness of the silicon layer 12 is typically and preferably determined as a function of the performance characteristics of the microelectronics fabrication within which is formed the silicon layer 12. Typically and preferably, the silicon layer 12 will be formed to a thickness such that it is only partially consumed when subsequently forming a metal silicide layer through reaction of a metal silicide forming metal with the silicon layer 12 while employing the method of the present invention.

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the substrate 10 and the silicon layer 12 have been exposed to a thermal exposure 14 to form a corresponding thermally annealed substrate 10' having formed thereupon a thermally annealed silicon layer 12'.

Within the first preferred embodiment of the present invention, exposure of the substrate 10 and the silicon layer 12 to the thermal exposure 14 is undertaken employing a thermal exposure method which provides preferably both the thermally annealed substrate 10' and the thermally annealed silicon layer 12', or minimally at least the thermally annealed silicon layer 12' at a temperature greater than a silicidation temperature at which a metal silicide forming metal will form a metal silicide layer upon the thermally annealed silicon layer 12'. Such a silicidation temperature will typically vary somewhat depending upon the nature and selection of the metal silicide forming metal, but will generally be in a range of from about 350 to about 600 degrees centigrade. Metal silicide forming metals which may be employed within the method of the present invention include but are not limited to titanium, tungsten, tantalum, molybdenum, niobium, platinum, nickel and cobalt. Nickel and cobalt are particularly preferred metal silicide forming metals when employed within the present invention, since they both form metal silicide layers with particularly low contact resistances.

Within the method of the present invention, although the thermal annealing of the substrate 10 and the silicon layer 12 to form the corresponding thermally annealed substrate 10' and the thermally annealed silicon layer 12' may be undertaken employing any of several methods, including but not limited to: (1) rapid thermal annealing methods which provide substantial temperature excursions within limited time periods (i.e. on the order of 30 degrees centigrade per second); and (2) more conventional thermal annealing methods which provide lower rates of temperature rise, for the present invention, the thermal annealing of the substrate 10 and the silicon layer 12 is of necessity undertaken within a reactor chamber and at a reactor chamber pressure at which there is subsequently deposited a metal silicide forming metal upon the thermally annealed silicon layer 12'. Thus, typically and preferably, although not exclusively, the thermal annealing of the substrate 10 and the silicon layer 12 is undertaken incident to contact within the reactor chamber of the substrate 10 with a heated chuck or susceptor upon which is positioned the substrate 10. As is also understood by a person skilled in the art, such metal silicide forming metal deposition methods as employed within the present invention are typically undertaken at a sufficiently low pressure (typically in the range of from about 0.5 to about 2 mtorr) to effectively exclude oxygen gas (i.e. an oxygen partial pressure of less than about 1E-7 mtorr) within the reactor chamber.

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein the thermally annealed silicon layer 12' is exposed to a metal flux 16 derived from the metal silicide forming metal to form in-situ a metal silicide layer 18 in conjunction with partial consumption of the thermally annealed silicon layer 12' to form a partially consumed thermally annealed silicon layer 12".

Within the first preferred embodiment of the present invention, the metal flux 16 may be provided while employing any of several metal deposition methods as are conventional in the art of microelectronics fabrication, including but not limited to thermally assisted evaporation methods, electron beam assisted evaporation methods and physical vapor deposition (PVD) sputtering methods. Such metal deposition methods typically and preferably provide the metal flux 16 formed of metal atoms or metal atom clusters having a single elemental composition, although it is feasible within the method of the present invention to employ either a metal alloy or multiple metal deposition sources to form a mixed metal metal silicide layer 18. As is illustrated within FIG. 3, within the first preferred embodiment of the present invention the metal silicide layer 18 is formed to a thickness such that there is only partial consumption of the thermally annealed silicon layer 12' when forming the partially consumed thermally annealed silicon layer 12".

Upon forming the microelectronics fabrication whose schematic cross-sectional diagram is illustrated in FIG. 3, there is formed a microelectronics fabrication having formed therein a metal silicide layer with uniformly low contact resistance and minimal process complexity. The microelectronics fabrication so formed has formed therein the metal silicide layer with uniformly low contact resistance and minimal process complexity by thermally annealing a silicon layer having a silicon surface other than an amorphous silicon surface in the presence of a metal flux of a metal silicide forming metal to form in-situ upon a partially consumed thermally annealed silicon layer formed from the thermally annealed silicon layer the metal silicide layer.

Second Embodiment

Figure 4:
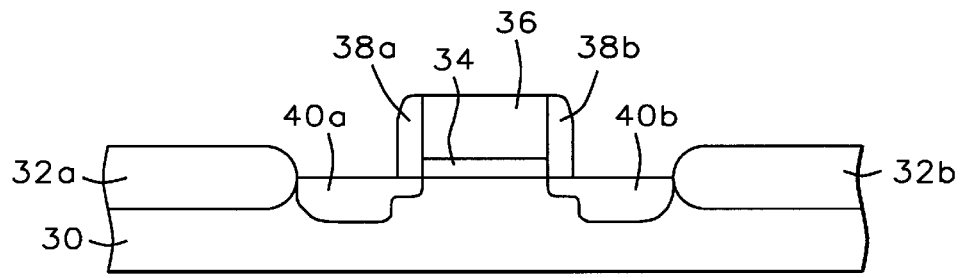
FIG. 4, FIG. 5, FIG. 6 and FIG. 7 show a series of schematic cross-sectional diagrams illustrating the results of forming, in accord with a more specific embodiment of the present invention which comprises a second preferred embodiment of the present invention, a series of metal silicide layers upon a polysilicon gate electrode and a pair of source/drain regions within a silicon semiconductor substrate within a field effect transistor within a semiconductor integrated circuit microelectronics fabrication.

Referring now to FIG. 4 to FIG. 7, there is shown a series of schematic cross-sectional diagrams illustrating the results of forming, in accord with a more specific embodiment of the present invention which comprises a second preferred embodiment of the present invention, a series of patterned metal silicide layers within a field effect transistor (FET) within a semiconductor integrated circuit microelectronics fabrication. Shown in FIG. 4 is a schematic cross-sectional diagram of the semiconductor integrated circuit microelectronics fabrication at an early stage in its fabrication in accord with the second preferred embodiment of the present invention.

Shown in FIG. 4 is a silicon semiconductor substrate 30 having formed within and upon its surface a pair of isolation regions 32a and 32b which define an active region of the silicon semiconductor substrate 30. Although it is known in the art of semiconductor integrated circuit microelectronics fabrication that silicon semiconductor substrates are available with either dopant polarity, various dopant concentrations and several crystallographic orientations, for the second preferred embodiment of the present invention, the silicon semiconductor substrate 30 is preferably a (100) silicon semiconductor substrate having an N- or P-doping. Similarly, although it is also known in the art of semiconductor integrated circuit microelectronics fabrication that isolation regions may be formed within or upon silicon semiconductor substrates to define active regions of those silicon semiconductor substrates while employing methods including but not limited to isolation region thermal growth methods and isolation region deposition/patterning methods, for the second preferred embodiment of the present invention the isolation regions 32a and 32b are preferably formed within and upon the silicon semiconductor substrate 30 to define an active region of the silicon semiconductor substrate 30 while employing an isolation region thermal growth method at a temperature of from about 800 to about 1000 degrees centigrade to form the isolation regions 32a and 32b of silicon oxide within and upon the silicon semiconductor substrate 30.

Shown also within FIG. 4 formed within or upon the active region of the silicon semiconductor substrate 30 as defined by the isolation regions 32a and 32b is a series of structures which comprises a field effect transistor (FET). The series of structures includes: (1) a gate dielectric layer 34 formed upon the active region of the silicon semiconductor substrate 30; (2) a polysilicon gate electrode 36 formed and aligned upon the gate dielectric layer 34; (3) a pair of dielectric spacer layers 38a and 38b formed adjoining a pair of opposite edges of the gate dielectric layer 34 and the polysilicon gate electrode 36; and (4) a pair of source/drain regions 40a and 40b, having incorporated therein a corresponding pair of lightly doped drain (LDD) extensions, formed within the active region of the silicon semiconductor substrate 30 at areas not covered by the gate dielectric layer 34 and the polysilicon gate electrode 36. Each of the foregoing structures within the series of structures which comprises the field effect transistor (FET) may be formed employing methods and materials as are conventional in the art of semiconductor integrated circuit microelectronics fabrication.

For example, although it is known in the art of semiconductor integrated circuit microelectronics fabrication that gate dielectric layers may be formed through patterning, while employing methods as are conventional in the art, of blanket gate dielectric layers formed upon silicon semiconductor substrates employing methods including but not limited to blanket gate dielectric layer thermal growth methods and blanket gate dielectric layer deposition/patterning methods, for the second preferred embodiment of the present invention the gate dielectric layer 34 is preferably formed through patterning, while employing methods as are conventional in the art, of a blanket gate dielectric layer formed of silicon oxide formed through thermal oxidation of the silicon semiconductor substrate 30 at a temperature of from about 800 to about 1000 degrees centigrade to thus ultimately form the gate dielectric layer 34 of thickness about 30 to about 70 angstroms.

In addition, although it is also known in the art of semiconductor integrated circuit microelectronics fabrication that polysilicon gate electrodes may be formed through patterning, while employing methods as are conventional in the art, of blanket polysilicon layers formed within semiconductor integrated circuit microelectronics fabrications employing deposition methods including but not limited to chemical vapor deposition (CVD) methods, low pressure chemical vapor deposition (LPCVD) methods and physical vapor deposition (PVD) sputtering methods, for the second preferred embodiment of the present invention the polysilicon gate electrode 36 is preferably formed through patterning, while employing methods as are conventional in the art, of a blanket polysilicon layer formed employing a chemical vapor deposition (CVD) method. Preferably, the blanket polysilicon layer has incorporated therein a dopant at an appropriate concentration to provide the blanket polysilicon layer of sheet resistance from about 100 to about 300 ohms/sq. Preferably, the blanket polysilicon layer, and the corresponding polysilicon gate electrode 36, are formed to a thickness of from about 1500 to about 2000 angstroms.

Further, the dielectric spacer layers 38a and 38b, as is conventional in the art of semiconductor integrated circuit microelectronics fabrication, may be formed through anisotropic etching of a blanket dielectric layer formed upon the microelectronics fabrication whose schematic cross-sectional diagram is illustrated in FIG. 4 absent the dielectric spacer layers 38a and 38b. Preferably the dielectric spacer layers 38a and 38b are formed from a dielectric material selected from the group including but not limited to silicon oxide dielectric materials, silicon nitride dielectric materials and silicon oxynitride dielectric materials.

Finally, the source/drain regions 40a and 40b, as is also conventional in the art of semiconductor integrated circuit microelectronics fabrication, may be formed employing ion implant methods which will typically include a low dose ion implant at an ion implantation dose of from about 1E14 to about 5E14 ions per square centimeter and an ion implantation energy of from about 30 to about 50 keV while employing the gate dielectric layer 34 and the polysilicon gate electrode 36 as a mask, followed by a high dose ion implant at an ion implantation dose of from about 3E15 to about 6E15 ions per square centimeter and an ion implantation energy of from about 55 to about 65 keV while employing the gate dielectric layer 34, the polysilicon gate electrode 36 and the dielectric spacer layers 38a and 38b as a mask. Each of the low dose ion implant and the high dose ion implant will typically and preferably employ a dopant of polarity appropriate to the polarity of the field effect transistor (FET) desired to be formed, such dopant being selected from the group of dopants including but not limited to boron containing dopants, phosphorus containing dopants and arsenic containing dopants.

Figure 5:
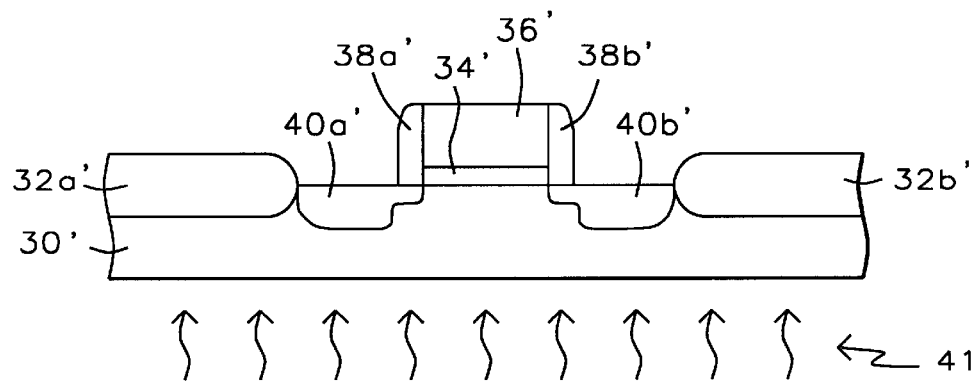

Referring now to FIG. 5, there is shown a schematic cross-sectional diagram illustrating the results of further processing of the semiconductor integrated circuit microelectronics fabrication whose schematic cross-sectional diagram is illustrated in FIG. 4. Shown in FIG. 5 is a schematic cross-sectional diagram of a semiconductor integrated circuit microelectronics fabrication otherwise equivalent to the semiconductor integrated circuit microelectronics fabrication whose schematic cross-sectional diagram is illustrated in FIG. 4, but wherein the semiconductor integrated circuit microelectronics fabrication is exposed to a thermal exposure 41. There is thus formed, as illustrated within the schematic cross-sectional diagram of FIG. 5, a thermally annealed silicon semiconductor substrate 30' having formed within and upon its surface a pair of thermally annealed isolation regions 32a' and 32b' which define an active region of the thermally annealed silicon semiconductor substrate 30'. There is also shown within the active region of the thermally annealed silicon semiconductor substrate 30' a series of structures which comprises a thermally annealed field effect transistor (FET), where the series of structures includes: (1) a thermally annealed gate dielectric layer 34' having formed and aligned thereupon; (2) a thermally annealed polysilicon gate electrode 36', both of which have formed and aligned at a pair of their opposite edges; (3) a pair of thermally annealed dielectric spacer layers 38a' and 38b'; and (4) a pair of thermally annealed source/drain regions 40a' and 40b' formed into the active region of the thermally annealed silicon semiconductor substrate 30' at areas not covered by the thermally annealed gate dielectric layer 34' and the thermally annealed polysilicon gate electrode 36'.

Within the second preferred embodiment of the present invention, the thermal exposure 41 is preferably provided employing methods and limitations analogous or equivalent to the methods and limitations employed in providing the therma exposure 14 within the first preferred embodiment of the present invention as illustrated within the schematic cross-sectional diagram of FIG. 2.

Figure 6:
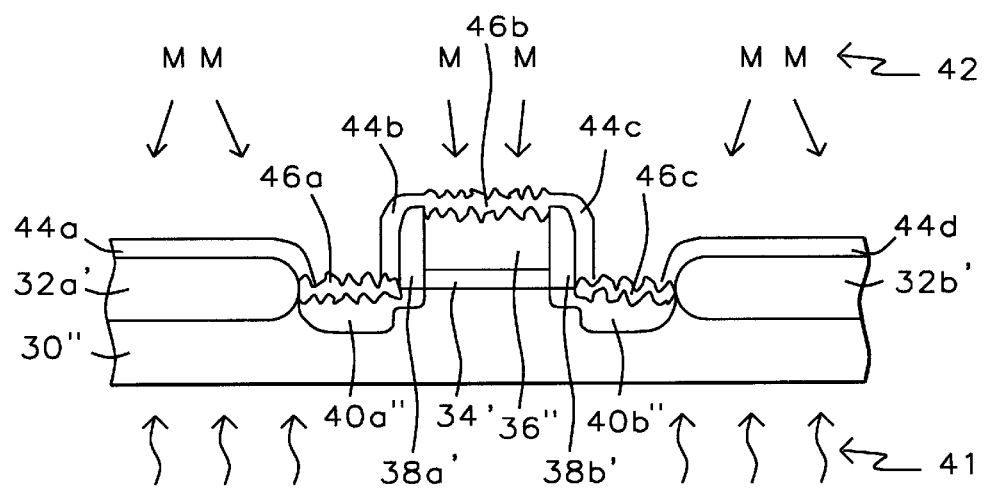

Referring now to FIG. 6, there is shown a schematic cross-sectional diagram illustrating the results of further processing of the semiconductor integrated circuit microelectronics fabrication whose schematic cross-sectional diagram is illustrated in FIG. 5. Shown in FIG. 6 is a schematic cross-sectional diagram of a semiconductor integrated circuit microelectronics fabrication otherwise equivalent to the semiconductor integrated circuit microelectronics fabrication whose schematic cross-sectional diagram is illustrated in FIG. 5, but wherein the thermally annealed semiconductor integrated circuit microelectronics fabrication as illustrated within the schematic cross-sectional diagram of FIG. 5 is exposed to a metal flux 42 to form: (1) a pair of metal silicide layers 46a and 46c formed upon a partially consumed thermally annealed silicon semiconductor substrate 30" at the location of the corresponding partially consumed thermally annealed source/drain regions 40a" and 40b"; and (2) a metal silicide layer 46b at the location of a partially consumed thermally annealed polysilicon gate electrode 36". Similarly, there is also shown formed upon other regions of the thermally annealed semiconductor integrated circuit microelectronics fabrication which are not susceptible to reaction with the metal silicide forming metal employed within the metal flux 42 a series of metal silicide forming metal layer residues 44a, 44b, 44c and 44d.

Within the second preferred embodiment of the present invention, the metal flux 42 is preferably provided employing methods and materials analogous or equivalent to the methods and materials as are employed in providing the metal flux 16 within the first preferred embodiment of the present invention as illustrated within the schematic cross-sectional diagram of FIG. 3. Similarly with the first preferred embodiment of the present invention, within the second preferred embodiment of the present invention the metal flux 42 is preferably a cobalt metal silicide forming metal flux or a nickel metal silicide forming metal flux, since both cobalt silicide and nickel silicide provide particularly low contact resistances when formed within semiconductor integrated circuit microelectronics fabrications.

As is illustrated within the schematic cross-sectional diagram of FIG. 6, and advantageously within the second preferred embodiment of the present invention, the method of the present invention may be employed to form multiple metal silicide layers simultaneously upon different types of silicon layers within different locations within a microelectronics fabrication. Similarly, although not specifically illustrated within the schematic cross-sectional diagram of FIG. 6, it is also plausible to form simultaneously with the metal sillcide layers 46a, 46b and 46c a metal silicide layer upon a polysilicon interconnect layer formed upon either the isolation region 32a or 32b.

Figure 7:
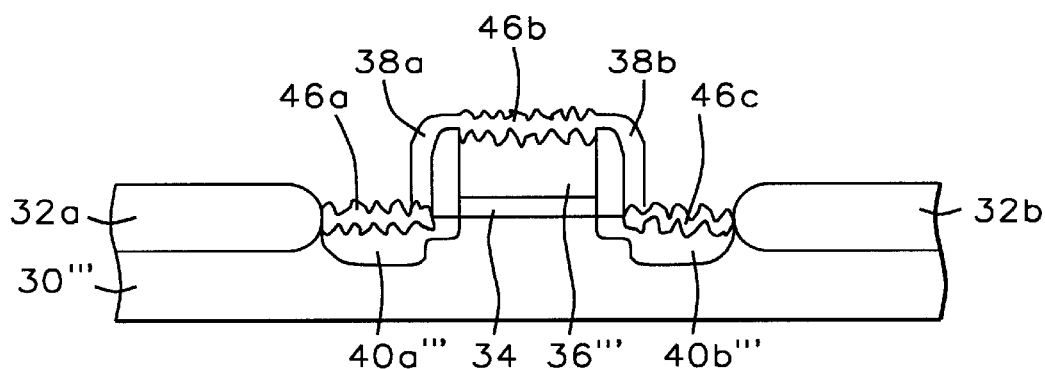

Referring now to FIG. 7, there is shown a schematic cross-sectional diagram illustrating the results of further processing of the semiconductor integrated circuit microelectronics fabrication whose schematic cross-sectional diagram is illustrated in FIG. 6. Shown in FIG. 7 is a schematic cross-sectional diagram of a semiconductor integrated circuit microelectronics fabrication otherwise equivalent to the semiconductor integrated circuit microelectronics fabrication whose schematic cross-sectional diagram is illustrated in FIG. 6, but wherein: (1) the semiconductor integrated circuit microelectronics fabrication has been returned to a temperature beneath the silicidation temperature employed for forming the metal silicide layers 46a, 46b and 46c; and (b) there is then stripped from the semiconductor integrated circuit microelectronics fabrication the metal silicide forming metal layer residues 44a, 44b, 44c and 44d. The metal silicide forming metal layer residues 44a, 44b, 44c and 44d may be stripped from the semiconductor integrated circuit microelectronics fabrication whose schematic cross-sectional diagram is illustrated in FIG. 6 to provide in part the semiconductor integrated circuit microelectronics fabrication whose schematic cross-sectional diagram is illustrated in FIG. 7 while employing wet chemical stripping methods as are conventional in the art of microelectronics fabrication. Within the second preferred embodiment of the present invention when the metal flux 42 is a cobalt metal flux, the metal silicide forming metal layer residues 44a, 44b, 44c and 44d which are thus formed of cobalt may be stripped from the semiconductor integrated circuit microelectronics fabrication whose schematic cross-sectional diagram is illustrated in FIG. 6 to provide in part the semiconductor integrated circuit microelectronics fabrication whose schematic cross-sectional diagram is illustrated in FIG. 7 while employing a wet chemical stripper solution comprising 37% aqueous hydrochloric acid and 30% hydrogen peroxide, typically at a 37% hydrochloric acid:30% hydrogen peroxide:water volume ratio of from about 1:1:2 to about 1:1:5.

The semiconductor integrated circuit microelectronics fabrication whose schematic cross-sectional diagram is illustrated in FIG. 7 may be subjected to further thermal annealing in order to provide a uniformly lower and stable contact resistance to the metal silicide layers 46a, 46b and 46c. Such additional thermal annealing of the metal silicide layers 46a, 46b and 46c is preferably undertaken at a temperature of from about 700 to about 900 degrees centigrade for a time period of from about 20 seconds to about 1 minute in an atmosphere of nitrogen (N2) at a pressure of from about 750 to about 760 torr.

Upon forming the semiconductor integrated circuit microelectronics fabrication whose schematic cross-sectional diagram is illustrated in FIG. 7, there is formed a semiconductor integrated circuit microelectronics fabrication having formed therein a series of patterned metal silicide layers upon a pair of source/drain regions and a polysilicon gate electrode within a field effect transistor (FET). The series of patterned metal silicide layers is formed with uniformly low contact resistance and with minimal process complexity by employing when forming the series of patterned metal silicide layers a thermal annealing method which employs a series of silicon layers having a series of surfaces other than amorphous silicon surfaces and thermally annealing the series of silicon layers to form a series of thermally annealed silicon layers to a temperature greater than a silicidation temperature, while exposing the series of thermally annealed silicon layers to a metal silicide forming metal deposited in a fashion such that the metal silicide forming metal reacts in-situ with the thermally annealed silicon layers to form the series of metal silicide layers in conjunction with partial consumption of the thermally annealed silicon layers to form a series of partially consumed thermally annealed silicon layers.

EXAMPLES

There was obtained a series of four (100) silicon semiconductor substrates and formed upon each silicon semiconductor substrate within the series of four (100) silicon semiconductor substrates a cobalt silicide metal silicide layer in accord with the first preferred embodiment of the present invention. For forming the series of four cobalt silicide metal silicide layers there was employed a physical vapor deposition (PVD) sputtering method employing argon gas as a sputtering ion for sputtering a cobalt target from which was provided a cobalt metal flux to form the cobalt metal silicide layers. There was no argon sputtering of the silicon semiconductor substrates, although each of the silicon semiconductor substrates was first immersed within a 50:1 dilute hydrofluoric acid solution, and subsequently rinsed, in order to remove any native silicon oxide from the silicon semiconductor substrates. The physical vapor deposition (PVD) sputtering method also employed: (1) a reactor chamber pressure of about 1.5 mtorr; (2) an argon ion cobalt target bias sputtering power of about 450 watts; (3) an argon flow rate of about 60 standard cubic centimeters per minute (sccm). The cobalt silicide metal silicide layers were formed at four temperatures in the range of 500 to 575 degrees centigrade. Each cobalt silicide layer was formed to a thickness of about 250 angstroms. The sheet resistance of each of the cobalt silicide layers was then determined employing methods as are conventional in the art of microelectronics fabrication.

Each of the cobalt silicide layers was then immersed within a 37% hydrochloric acid:30% hydrogen peroxide:water solution at a volume ratio of 1:1:3 and a temperature of about 50 degrees centigrade for a time period of about 8 minutes to simulate a stripping typically employed for removing unreacted cobalt residue layers when forming patterned cobalt silicide layers when employing thermal annealing methods. The sheet resistance of each of the cobalt silicide layers was again measured after immersion in the simulated stripping solution.

Finally, each of the cobalt silicide layers was then thermally annealed at a second temperature of about 800 degrees centigrade within a nitrogen atmosphere at a pressure of about 760 torr for a time period of about 30 seconds. The sheet resistance of each of the cobalt silicide layers was again remeasured.

Figure 8:
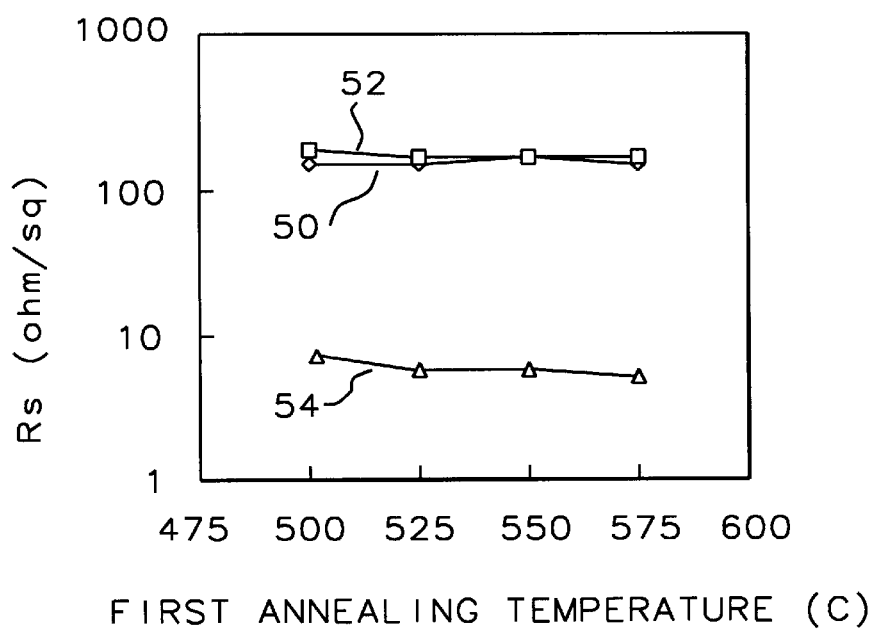
FIG. 8 shows a plot of Sheet Resistance versus First Annealing Temperature for a series of cobalt silicide layers formed in accord with the method of the present invention.

The measured sheet resistances for each of the four cobalt silicide layers are plotted in FIG. 8 as a function of first annealing temperature. Within FIG. 8, curve 50 corresponds with the sheet resistances of the cobalt silicide layers as deposited at the four temperatures within the range of 500 to 575 degrees centigrade. Curve 52 corresponds with the sheet resistances of the cobalt silicide layers after immersion within the 37% aqueous hydrochloric acid:30% aqueous hydrogen peroxide solution. Finally, curve 54 corresponds with the sheet resistances of the cobalt silicide layers after annealing at the second temperature of about 800 degrees centigrade.

For comparison purposes, each silicon semiconductor substrate within a second series of nine (100) silicon semiconductor substrates had formed thereupon a cobalt layer of thickness of about 100 angstroms. The cobalt layers were formed employing a physical vapor deposition (PVD) sputtering method, and each cobalt layer in turn had formed thereupon a titanium nitride capping layer of thickness about 200 angstroms. Each of the nine (100) silicon semiconductor substrates was then annealed at a different temperature in the range of 450 to 650 degrees centigrade to form from the cobalt layer a cobalt silicide layer. The thermal annealings were undertaken in a nitrogen atmosphere at a pressure of about 760 torr for a time period of about 30 seconds each. The sheet resistances of the composite cobalt silicide layer/titanium nitride layer stack layer composites were then measured employing measurement techniques as are conventional in the art of microelectronics fabrication.

The titanium nitride layers were then stripped from the cobalt silicide layers employing a 28% aqueous ammonium hydroxide: aqueous 30% hydrogen peroxide:water solution at a 1:1:5 volume ratio and a temperature of about 60 degrees centigrade for a time period of about 8 minutes. The sheet resistances of the cobalt silicide layers alone were again measured.

The cobalt silicide layers where then immersed in the aqueous 37% aqueous hydrogen chloride:30% aqueous hydrogen peroxide:water solution as employed for the simulated stripping of the four cobalt silicide layers formed upon the first four (100) silicon semiconductor substrates, similarly at a temperature of about 50 degrees centigrade for a time period of about 8 minutes. The sheet resistances of the cobalt silicide layers alone were again remeasured.

Figure 9:
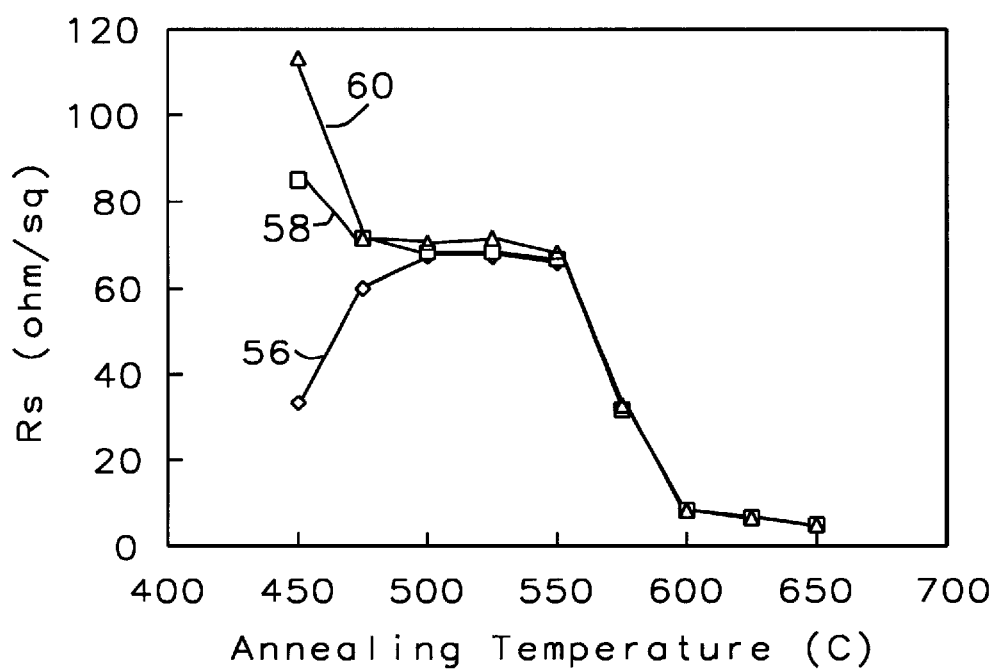
FIG. 9 shows a plot of Sheet Resistance versus Annealing Temperature for a series of cobalt silicide layers formed in accord with a method not in accord with the method of the present invention.

The measured values of the sheet resistances of the cobalt silicide layers are plotted in FIG. 9 as a function of annealing temperature. Within FIG. 9, curve 56 corresponds with the sheet resistances of the composite titanium nitridelcobalt silicide layers as a function of the annealing temperature. Similarly, curve 58 corresponds with the sheet resistances of the cobalt silicide layers alone after stripping the titanium nitride layers therefrom employing the 28% aqueous ammonium hydroxide:30% aqueous hydrogen peroxide solution. Finally, curve 60 corresponds with the sheet resistances of the cobalt silicide layers alone after simulated stripping within the 37% aqueous hydrochloric acid:30% hydrogen peroxide solution.

As is seen from review of the data presented in FIG. 8 in comparison with the data presented in FIG. 9, comparably uniformly low cobalt silicide sheet resistance (and thus contact resistance) may be obtained for a cobalt silicide layers formed employing the method of the present invention in comparison with a method which employs a cobalt layer deposition and sequential, rather than a less complex in-situ, thermal annealing to form a cobalt silicide metal silicide layer. Thus, the present invention provides a method for forming within a microelectronics fabrication a metal silicide layer with uniformly low contact resistance and minimal process complexity.

As is understood by a person skilled in the art, the preferred embodiments and examples of the present invention are illustrative of the present invention rather than limiting of the present invention. Revisions and modifications may be made to methods, materials, structures and dimensions through which are provided metal silicide layers formed in accord with the preferred embodiments and examples of the present invention which still providing metal silicide layers formed in accord with the present invention, as defined by the accompanying claims.

What is claimed is:

1. A method for forming a metal silicide layer comprising:
    providing a substrate;
    forming over the substrate a silicon layer, the silicon layer having other than an amorphous silicon surface;
    annealing thermally the silicon layer at a temperature greater than a silicidation temperature for forming a metal silicide layer upon the silicon layer to thus form from the silicon layer a thermally annealed silicon layer; and
    depositing upon the thermally annealed silicon layer a metal silicide forming metal employing a metal deposition method such that upon contact with the thermally annealed silicon layer the metal silicide forming metal reacts in-situ to form a metal silicide layer upon a partially consumed thermally annealed silicon layer formed from the thermally annealed silicon layer.

2. The method of claim 1 wherein the substrate is employed within a microelectronics fabrication selected from the group consisting of integrated circuit microelectronics fabrications, solar cell microelectronics fabrications, ceramic substrate microelectronics fabrications and flat panel display microelectronics fabrications.

3. The method of claim 1 wherein the silicon layer is formed from a silicon material selected from the group consisting of polycrystalline silicon materials and monocrystalline silicon materials.

4. The method of claim 1 wherein the metal silicide forming metal is selected from the group consisting of titanium, tungsten, tantalum, molybdenum, niobium, platinum, nickel and cobalt.

5. A method for forming a pair of metal silicide layers comprising:
    providing a substrate;
    forming over the substrate a first silicon layer and a second silicon layer, where each of the first silicon layer and the second silicon layer has other than an amorphous silicon surface;
    annealing thermally the first silicon layer and the second silicon layer at a temperature greater than a silicidation temperature for forming a metal silicide layer upon each of the first silicon layer and the second silicon layer to thus form from the first silicon layer a thermally annealed first silicon layer and to form from the second silicon layer a thermally annealed second silicon layer; and
    depositing upon the thermally annealed first silicon layer and the thermally annealed second silicon layer a metal silicide forming metal employing a metal deposition method such that upon contact with the thermally annealed first silicon layer and the thermally annealed second silicon layer the metal silicide forming metal reacts in-situ to form a first metal silicide layer upon a partially consumed thermally annealed first silicon layer formed from the thermally annealed first silicon layer and a second metal silicide layer upon a partially consumed thermally annealed second silicon layer formed from the thermally annealed second silicon layer.

6. The method of claim 5 wherein the substrate is employed within a microelectronics fabrication selected from the group consisting of integrated circuit microelectronics fabrications, solar cell microelectronics fabrications, ceramic substrate microelectronics fabrications and flat panel display microelectronics fabrications.

7. The method of claim 5 wherein the first silicon layer is formed from a polycrystalline silicon material and the second silicon layer is formed from a monocrystalline silicon material.

8. The method of claim 5 wherein the metal silicide forming metal is selected from the group consisting of titanium tungsten, tantalum, molybdenum, niobium, platinum, nickel and cobalt.

9. The method of claim 5 wherein the first metal silicide layer and the second metal silicide layer are employed within a field effect transistor.

10. The method of claim 1, wherein the silicon layer is thermally annealed at a temperature from about 350 to 600° C.

11. The method of claim 5, wherein the first and second silicon layers are thermally annealed at a temperature from about 350 to 600° C.

12. A method for forming a metal silicide layer, comprising the steps:
    providing a substrate;
    forming a silicon layer over the substrate; the silicon layer having other than an amorphous silicon surface;
    thermally annealing the silicon layer in a non-oxygen environment at a temperature from about 350 to 600° C. that is greater than a silicidation temperature for forming a metal silicide layer upon the thermally annealed silicon layer;
    depositing a metal silicide forming metal upon the thermally annealed silicon layer by a metal deposition method such that upon contact with the thermally annealed silicon layer, the metal silicide forming metal reacts in-situ to form a metal silicide layer upon a partially consumed thermally annealed silicon layer formed from the thermally annealed silicon layer.

13. The method of claim 12, wherein the metal silicide forming metal is selected from the group consisting of titanium, tungsten, tantalum, molybdenum, niobium, platinum, nickel, cobalt and a combination of two or more of such metals.

14. The method of claim 12, wherein the metal silicide forming metal is selected from the group consisting of nickel and cobalt.

15. The method of claim 12, wherein the metal silicide forming metal deposition is conducted at a pressure of from about 0.5 to 2 mTorr.

16. The method of claim 12, wherein the metal deposition method is selected from the group consisting of thermally assisted evaporation methods, electron beam assisted evaporation methods and PVD sputtering methods.

* * * * *